United States Patent
Nguyen

(10) Patent No.: US 7,630,843 B2
(45) Date of Patent: Dec. 8, 2009

(54) METHOD, APPARATUS, AND SYSTEM FOR POWER SOURCE FAILURE PREDICTION

(75) Inventor: Don J. Nguyen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/525,708

(22) Filed: Sep. 21, 2006

(65) Prior Publication Data

US 2008/0077340 A1    Mar. 27, 2008

(51) Int. Cl.
*G01R 27/14* (2006.01)
(52) U.S. Cl. .......................... 702/65; 702/63; 324/713; 320/136
(58) Field of Classification Search ................ 702/57, 702/58, 60, 63–65; 320/135, 136; 324/600, 324/691, 713; 340/636.1, 636.11, 636.12, 340/636.15, 636.17, 636.19, 660–663; 713/340; 361/88, 92
See application file for complete search history.

(56) References Cited

U.S. PATENT DOCUMENTS

| | | | | | |
|---|---|---|---|---|---|
| 5,027,294 | A | * | 6/1991 | Fakruddin et al. ........... | 713/300 |
| 5,166,623 | A | * | 11/1992 | Ganio ........................ | 324/427 |
| 5,278,509 | A | * | 1/1994 | Haynes et al. .............. | 324/427 |
| 6,603,286 | B2 | * | 8/2003 | Herrmann et al. ........... | 320/134 |
| 2006/0082375 | A1 | * | 4/2006 | Coates ....................... | 324/430 |

OTHER PUBLICATIONS

Pending U.S. Appl. No. 11/155,208; Title: "Providing Overload Protection In Battery Operation".; Inventor: Don J. Nguyen et al.; Filing Date: May 24, 2002.
Pending U.S. Appl. No. 11/453,780; Title: "Low-Power Battery Pack With Hall-Effect Sensor".; Inventor: Don J. Nguyen; Filing Date: Jun. 14, 2006.

* cited by examiner

*Primary Examiner*—Manuel L Barbee
(74) *Attorney, Agent, or Firm*—Blakely, Sokoloff, Taylor & Zafman LLP

(57) ABSTRACT

Some embodiments of a method, apparatus, and system for power source failure prediction are described. According to some embodiments, the system may include, among other things, a display device to draw power from a direct current power source, two or more electrical lines positioned on either side of the direct current power source to determine a voltage across the direct current power source, and a power source management unit coupled to the two or more electrical lines to measure the voltage. In some embodiments, a cell monitoring unit may be coupled to the two or more electrical lines to measure the voltage for the power source management unit, where the cell monitoring unit is capable of converting the measured voltage to a digital signal, measuring the rate of change of the voltage over a period of time, and providing information to the power source management unit. Other embodiments are described.

28 Claims, 6 Drawing Sheets

200

METHOD, APPARATUS, AND SYSTEM FOR POWER SOURCE FAILURE PREDICTION

TECHNICAL FIELD

Embodiments of this invention relate to the field of power sources and power source apparatus and, in particular, an aspect relates to predicting when a power source may be failing.

BACKGROUND

As processing capabilities increase, mobile computing devices demand more performance and additional features. In turn, the power requirements for these mobile computing devices increase. Moreover, the usage requirements of these mobile devices are increasing which results in increased reliance on batteries, fuel cells, and other direct current (DC) power sources. The increased power and usage requirements, along with compact platform designs, place a growing burden on power sources.

The increased burden has, in the aggregate, led to a rise of power source failures. Unfortunately, power source failures have not only caused loss of data and productivity, but, on occasions when the power source explodes or catches fire, led to the destruction of the power source and the device containing it. Conventional power source management technology is not able to detect or prevent damage to power sources and their enclosing devices. In particular, conventional power sources are not able to provide warning to their users in order to protect them from economic loss and physical harm.

BRIEF DESCRIPTION OF THE DRAWINGS

Embodiments of the invention are illustrated by way of example, and not by way of limitation, in the figures of the accompanying drawings.

DETAILED DESCRIPTION

The following description sets forth numerous specific details such as examples of systems, components, methods, and so forth, in order to provide an understanding of several embodiments of the invention. It will be apparent to one of ordinary skill in the art, however, that at least some embodiments of the invention may be practiced without these details. In other instances, well-known components or methods are not described in detail or are presented in block diagram format in order to avoid unnecessarily obscuring the invention. Thus, the details set forth are merely exemplary. Particular implementations may vary from these exemplary details and still be contemplated to be within the spirit and scope of the invention.

Moreover, the use of exemplary phrases such as "one embodiment," "some embodiments," and other similar phrases should not be understood to require mutually exclusive embodiments. The specification and drawings are, accordingly, to be regarded in an illustrative sense rather than a restrictive sense.

Figure 1A:
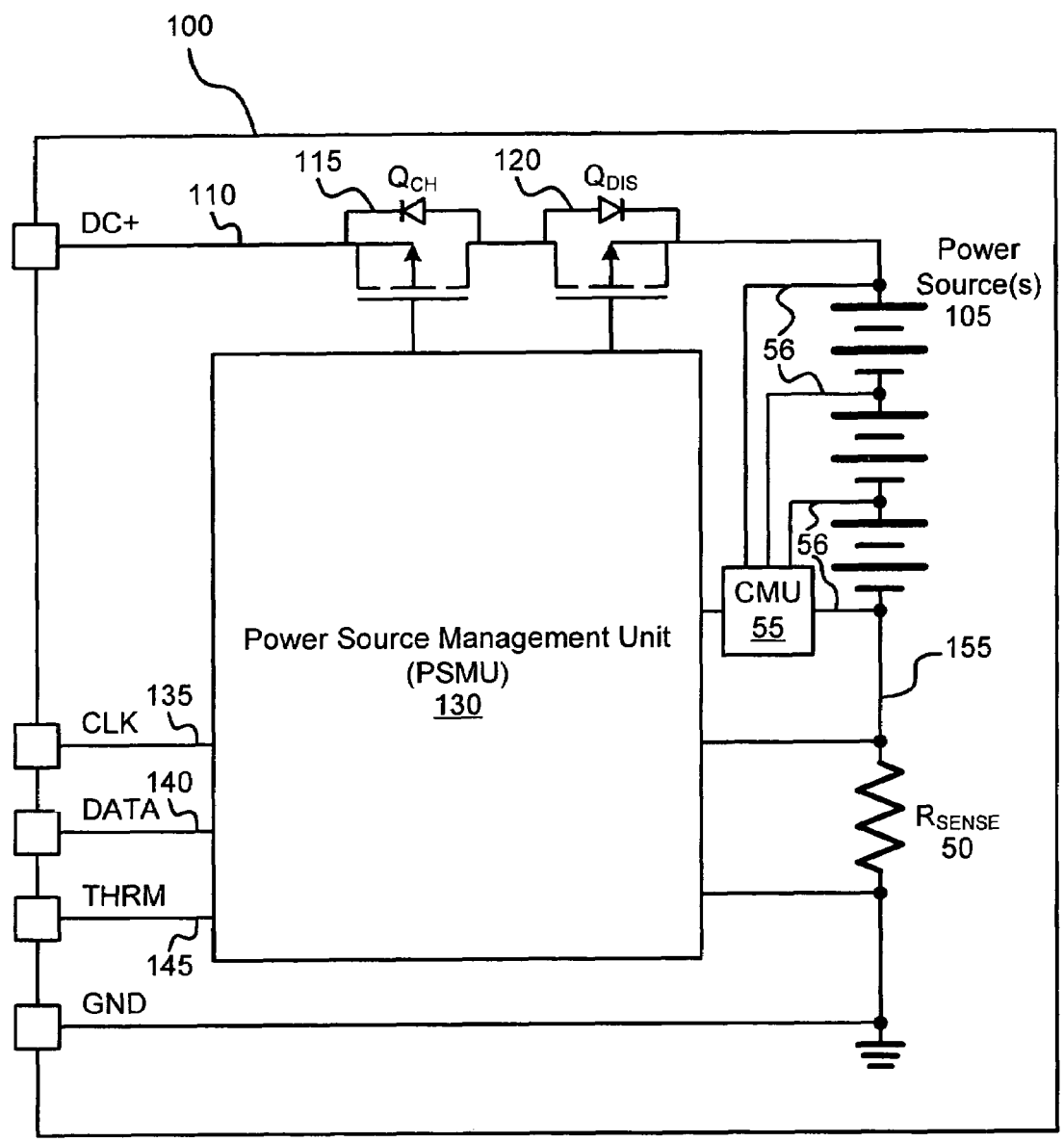
FIGS. 1A and 1B illustrate a direct current (DC) power source apparatus with various components to monitor the operation of the DC power source apparatus, according to some embodiments of the invention.

FIG. 1A illustrates a direct current (DC) power source apparatus 100 with a sense resistor 50 to detect operating current, and an optional cell monitoring unit (CMU) 55 to monitor at least a voltage across the entire or a subset of the power source(s) 105 using two or more electrical lines 56. The power source apparatus 100 may be used to provide power to a system such as, but not limited to, a mobile computing platform, e.g., a notebook computer, laptop computer, cellular telephone, personal digital assistant (PDA), handheld device, a remote terminal, etc., or a server computing platform, e.g., a blade server, a remote server, a terminal server, etc.). The power source apparatus 100 may include one or more power sources 105, such as, but not limited to, one or more battery cells, one or more fuel cells, etc., to provide power to the system through a power line 110, DC+. As one of ordinary skill in the relevant art would appreciate based at least on the teachings provided herein, many types of power sources 105 may be monitored in accordance with the embodiments of the invention, including, but not limited to, a zinc carbon battery, an alkaline battery, a nickel cadmium battery, a nickel metal hydride battery, a lithium ion battery, a lead acid battery, a metal air battery, a silver oxide battery, a mercury oxide battery, a thermal battery, various types of fuel cells, or any other type of direct current power source.

In some embodiments, two transistors, a charging transistor 115, $Q_{CH}$, and a discharging transistor 120, $Q_{DIS}$, such as, but not limited to, metal-oxide semiconductor field-effect transistors (MOSFETs), may be coupled to the power line 110 and to a power source management unit (PSMU) 130. The power source management unit 130 may control the charge and discharge transistors 115 and 120 to control the current into and out of the power sources 105. In some embodiments, the charge transistor 115 may facilitate charging of the power sources 105, and the discharge transistor 120 may facilitate discharging of the power sources 105. Moreover, in some embodiments, discharging of the power sources 105 may occur when the system draws power from the power source apparatus 100.

In some embodiments, the power source management unit 130 may also monitor the operating current of the power source apparatus 100 to ensure that the power source apparatus 100 is operating properly (e.g., to avoid a power source apparatus failure, which, in some embodiments, may be detectable from a change in current, while in other embodiments, a failure may only be predictable by monitoring voltage, as is described herein with respect to some embodiments of the CMU 55 and/or PSMU 130 and the electrical lines 56 of either FIGS. 1A and/or 1B). Moreover, in some embodiments, the PSMU 130 may determine how much charge remains in the power source apparatus 100. The remaining charge is related to the remaining operating time that a user may continue to use the system.

The power source management unit 130 may receive a clock signal from and communicate battery status information to the system via various signal lines such as a clock signal (CLK) line 135, a data signal (DATA) line 140, and a thermal signal (THRM) line 145. The CLK and DATA lines 135 and 140 implement communication protocols such as the SMBus interface compliant with Smart Battery Specifications. See, System Management Bus Specification, version 2.0, published by SMBus Specification Working Group, Aug.

3, 2000. See also, Smart Battery Data Set Specification, version 1.1, published by SBS Implementers Forum, Dec. 15, 1998. The THRM line 145 is used to indicate the temperature status of the power source apparatus to the system or to indicate the presence of a power source apparatus 100.

In order to monitor the operating current of the mobile computing device, the power source apparatus 100 may implement a sense resistor 50, $R_{SENSE}$, in series with the transmission power line 155 between the power sources 105 and the ground reference. The power source management unit 130 may determine the operating current based on the resistance of the sense resistor 50 and the voltage difference across the sense resistor 50. Although the resistance of the sense resistor 50 may be small (e.g., 10 milliohms (mΩ)), the power dissipation from the sense resistor 50 may be significant at least in part to a high current demand. For example, the power dissipation is about 1 Watt (W) using a sense resistor 50 of 10 mΩ and a demand current of 10 Amperes (A). This power dissipation burdens the thermal solution of the power source apparatus 100. Additionally, this power dissipation may heat up the power sources 105, which may lead to capacity reduction, a shortened life cycle, and reduced reliability.

Figure 1B:
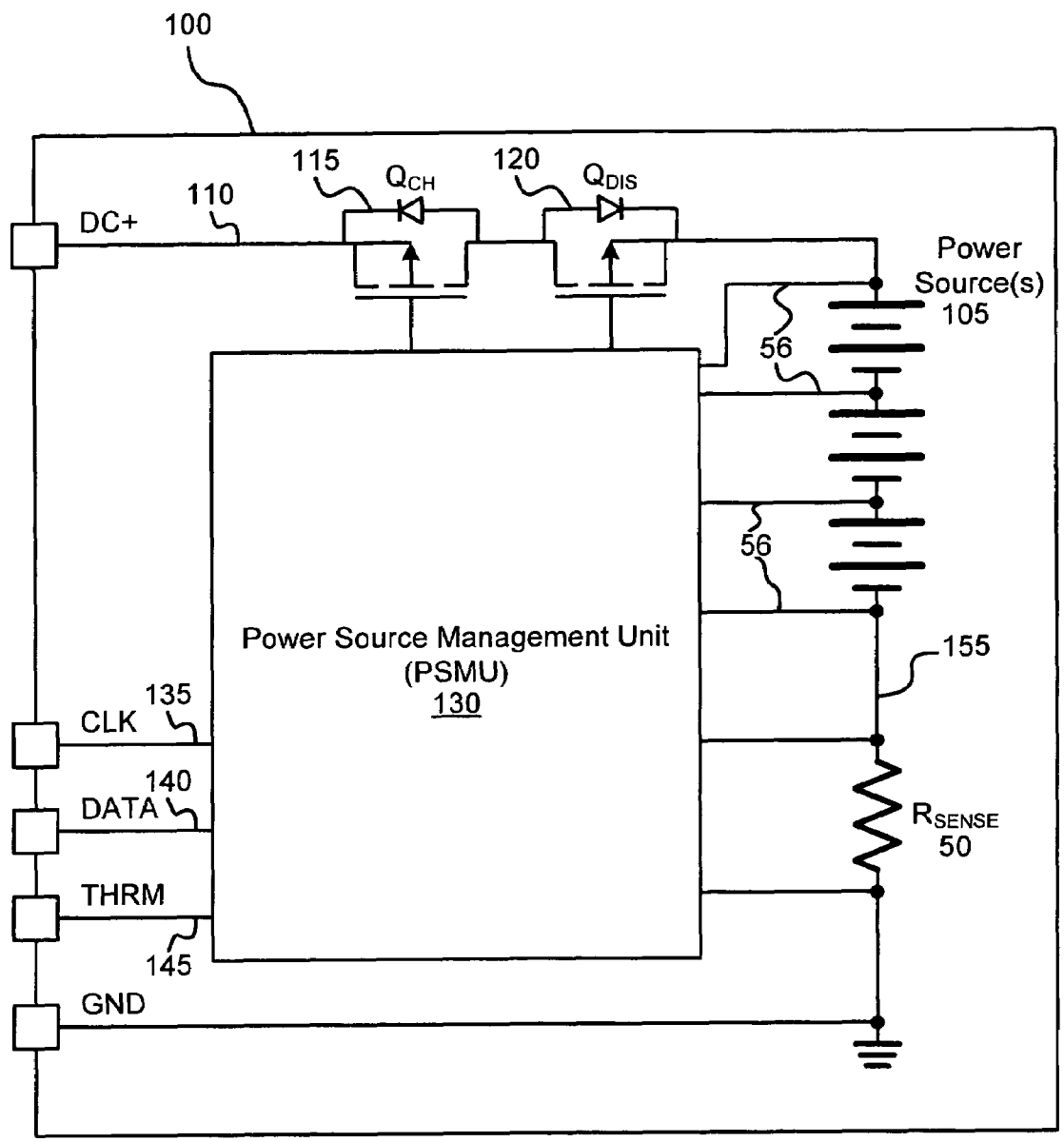

In some instances, however, such as, but not limited to, cases where the power source apparatus 100 may experience an internal short or other disruption, the PSMU 130 may not be able to detect and prevent damage to the apparatus 100 and any system containing it. In some embodiments, the PSMU 130 includes a voltage measurement module (described in further detail with respect to FIG. 2B) to monitor and predict an abnormal or defective power source. To facilitate the measurement of voltage, the PSMU may be coupled to at least the two or more electrical lines 56, as shown in FIG. 1B. In some embodiments, the two or more electrical lines 56 may be coupled to the CMU 55, as shown in FIG. 1A, with the CMU 55 coupled to the PSMU 130. Each embodiment is shown in FIGS. 1B and 1A, respectively.

According to some embodiments, the apparatus 100 may include the two or more electrical lines 56 positioned on either side of the DC power source(s) 105 to determine a voltage across the power source 105. Furthermore, the apparatus 100 may include the PSMU 130 coupled to the two or more electrical lines 56 to measure the voltage. The PSMU 130 may include the voltage measurement module, such as, but not limited to, module 280, as shown in FIG. 2B, having an analog-to-digital converter (ADC), such as, but not limited to, ADC 285, wherein the ADC is configured to convert the measured analog voltage to a digital signal, and the voltage measurement module is configured to measure the rate of change of the voltage over a period of time. In some embodiments, the period of time may be determined by the PSMU 130, the system, the type of power sources, or even by the user of the system. In some embodiments, the period of time may be of substantially the same duration for each period of monitoring and/or measurement. In some embodiments, the period of time may be altered, but as one of ordinary skill in the relevant art would appreciate based at least on the teachings described herein, the periods of time may preferably be substantially the same or substantially some multiple or fraction of the other periods of time for at least consistency of rate of change determinations.

According to some embodiments, the voltage measurement module may be further configured to compare the rate of change of the voltage with a threshold rate of change of the voltage, and to send an alert signal when the rate of change of the voltage approaches the threshold rate of change. Thus, PSMU 130 may be configured to measure the voltage during one or more power loading conditions of the direct current power source. In some embodiments, the one or more power loading conditions may include most or all of the conditions other than window idle states during execution of software code. In some embodiments, the activity factor or power state of the processor or core(s) may be an indication of the loading condition. As such, in some embodiment, the system may inform the PSMU 130 of the loading condition, which may then be used in the embodiments of the invention. In some embodiments, a protection module, such as, but not limited to, protection module 275, may be configured to receive an alert signal from the voltage measurement module, and to signal the analog front end to drive the discharge transistor to substantially isolate the power source(s) 105.

As shown in FIG. 1A, in some embodiments, the CMU 55 may be coupled to the two or more electrical lines 56 to measure the voltage for the PSMU 130, where the CMU 55 may be capable of converting the measured voltage to a digital signal, measuring the rate of change of the voltage over a period of time, and providing information to the PSMU 130. As one of ordinary skill in the art would appreciate based at least on the teachings provided herein, the CMU 55 may include logic of the voltage measurement module and/or the ADC. Indeed, the CMU 55 and PSMU 130 may include redundant logic in some embodiments of the invention.

Figure 2A:
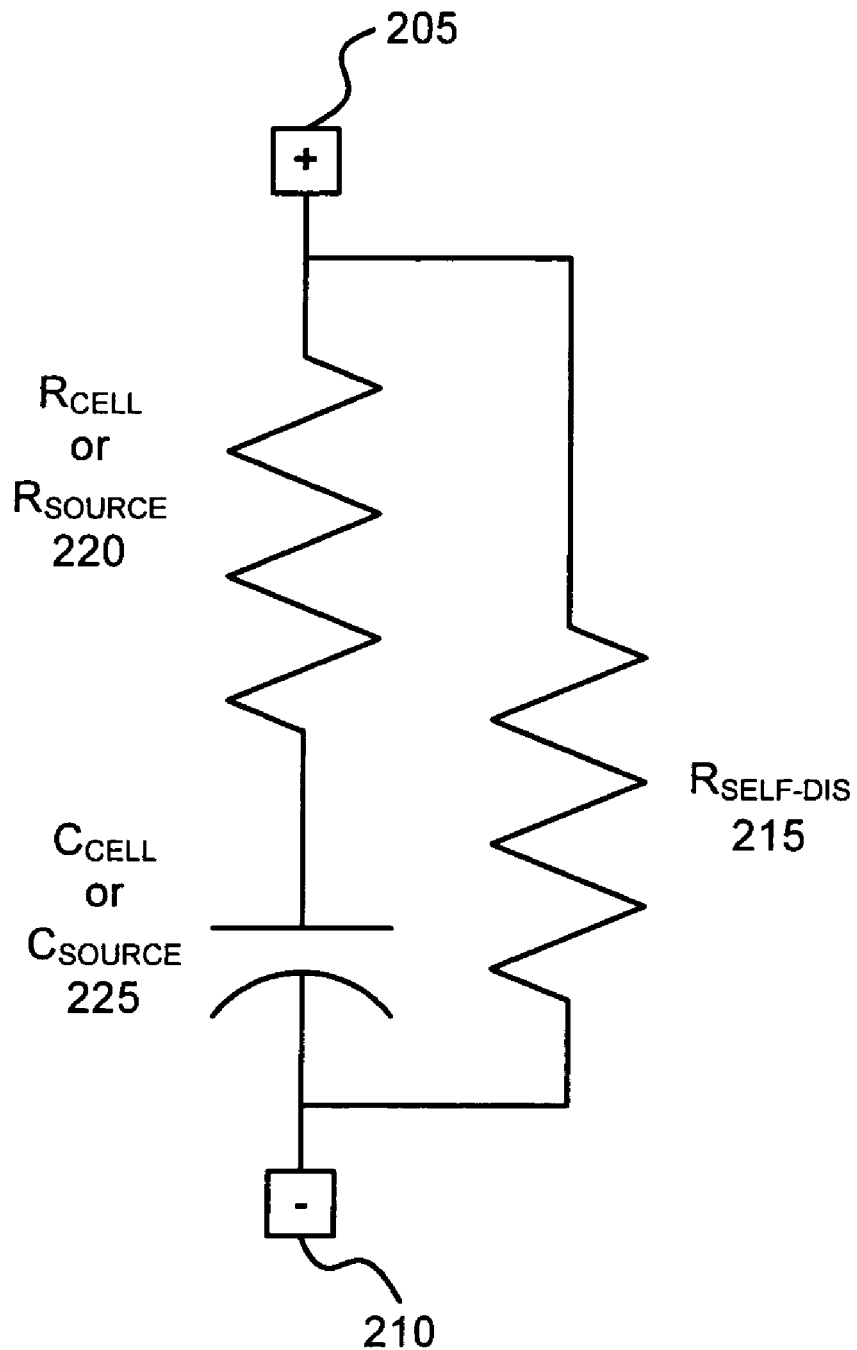
FIG. 2A illustrates a DC power source equivalent model, according to some embodiments of the invention.
Figure 2B:
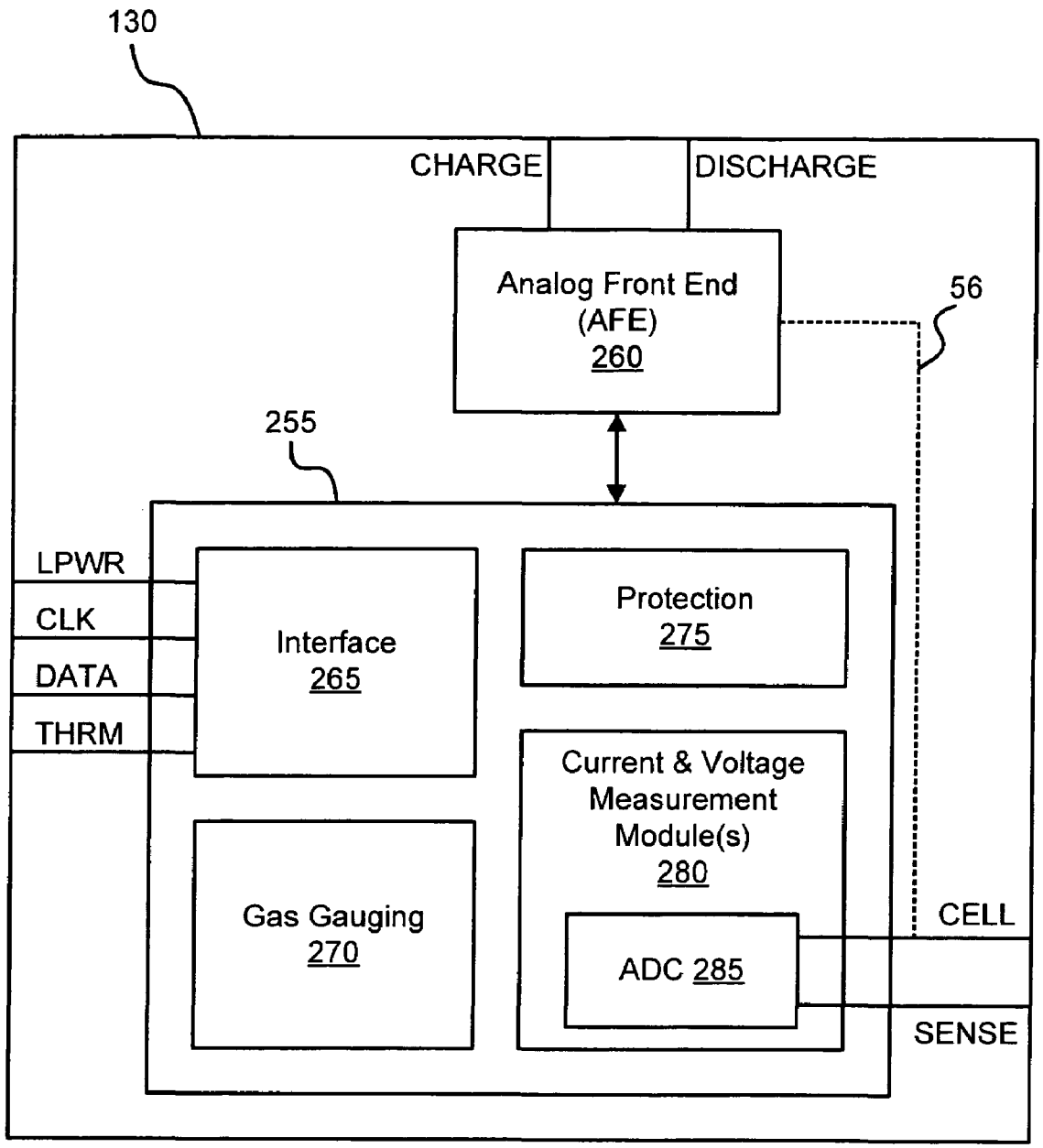
FIG. 2B illustrates a power source management unit (PSMU), according to some embodiments of the invention.

FIG. 2A illustrates a DC power source equivalent model 200, according to some embodiments of the invention. For many types of power sources, with an anode 205 and cathode 210, such as power source(s) 105, the self-discharge rate, represented by $R_{SELF-DIS}$ resistor 215, is either very low or undeterminable. In embodiments where the self discharge rate is very low, its effects can be ignored. In embodiments where the self discharge rate is determinable, its effect can be factored into the rate of change determinations. In either event, according to some embodiments of the invention, the equivalent resistance of the power source(s) may then be estimated by the series resistance, $R_{CELL}$ or $R_{SOURCE}$ resistor, 220, with a capacitance, $C_{CELL}$ or $C_{SOURCE}$, 225. One of ordinary skill in the relevant art would recognize that this series resistance may increase over cycles of charging and discharging. As such, for a power source which is operating normally, for the most part, the rate of increase in this series resistance may be predictable. In an abnormal or failing power source, however, this series resistance may increase dramatically, especially prior to a failure due to shorting or thermal runaway. In some embodiments of the invention, this series resistance may be monitored and the rate of change measured to compare with a desired, which in some embodiments may be the substantially the expected or normal rate of change of this resistance.

FIG. 2B illustrates the PSMU 130, according to some embodiments of the invention. In some embodiments, the PSMU 130 may include a microcontroller (MC) 255 and an analog front end (AFE) 260. The microcontroller 255 includes an interface 265, a gas gauging module 270, a protection module 275, and current and voltage measurement module(s) 280. In some embodiments, the PSMU 130 may include separate current module and voltage module, or it may include one module 280 that has the logic to perform the operations of both current and voltage measurement. The module(s) 280 may include an analog-to-digital converter (ADC) 285. Alternative embodiments of the power source management unit 130, microcontroller 255, and AFE 260 may include fewer or more components. Moreover, the microcontroller 255 and the AFE 260 may be fabricated on a single chip or on separate chips, or may be wholly or partially enabled in logic, as one of ordinary skill in the relevant art would appreciate based at least on the teachings provided herein.

In one embodiment, the AFE 260 may interface with the microcontroller 255 to control the charge and discharge transistor circuits 115 and 120. The microcontroller 255 may monitor the performance of the power source apparatus 100. The interface 265 may facilitate communications with the system in which the power source apparatus 100 is installed and/or operating. Exemplary signal lines coupled to the interface 265 may include the clock signal line, the data signal line, the thermal signal line, and the low power signal line, which are each described elsewhere herein. Some embodiments of the interface 265 may include more or less lines depending on the particular implementation. For example, some embodiments may include other signal lines to comply with future versions or variations of, or alternatives to the SMBus Specification, which is also described elsewhere herein.

In some embodiments, the gas gauging module 270 may determine how much charge remains in the power source(s) 105 at a given time. The gas gauging module 270 may make this determination based on the total capacity of the power source(s) 105, how much charge has been depleted over a given discharge time, and how much charge has been reintroduced into the power source(s) 105 over a given charge time. In this way, the gas gauging module 270 may operate similar to a fuel gauge of an automobile, by showing how much fuel has been used compared to the total capacity of the fuel tank. In alternative embodiments, other types of gauging technologies may be implemented, including directly measuring the actual charge in the power source(s) 105.

According to some embodiments of the invention, the protection module 275 may protect the power source apparatus 100 from potentially dangerous under-voltage and over-voltage conditions. Likewise, the protection module 275 may protect the power source apparatus 100 from dangerously high and dangerously low currents. Similarly, the protection module 275 may protect the power source apparatus 100 from potentially dangerous temperature conditions. In one embodiment, the protection module 275 may shut down (i.e., disconnect) the power source apparatus 100 if one or more potentially dangerous operating conditions occur. The protection module 275 may interface with the analog front end 260, the current and voltage measurement module(s) 280, or other components of the power source apparatus 100 to evaluate the operating conditions.

In some embodiments, the module(s) 280 may be coupled to the CMU 55 by the line denoted as CELL to receive the measurements and/or signals and optionally convert them to a digital signal with the analog-to-digital converter 285. In some embodiments, the module(s) 280 may be coupled to the electrical lines 56 by the line denoted as CELL to receive voltage readings. In such embodiments, the module(s) 280 may determine the voltage measurement and may perform the signal conversion.

In some embodiments, the ADC 285 may be any type of suitable ADC such as a flash ADC or another type of ADC. Furthermore, the ADC 285 may have 8-bit resolution, 14-bit resolution, or another resolution, as one of ordinary skill in the relevant art would appreciate based at least on the teachings provided herein. As such, in some embodiments, an 8-bit ADC would have 256 quantization levels, which would result in a voltage resolution of approximately 156.25 millivolts (mV) for a full-scale range of 10.0 Volts (V). Similarly, a 14-bit ADC would have 16384 quantization levels, which would result in a voltage resolution of approximately 0.61 mV for a full-scale range of 10.0 V.

In some embodiments, the module(s) 280 and/or CMU 55 may dynamically adjust the monitoring range of the ADC 285 or ADC or ADC logic internal to the CMU 55. In some embodiments, the adjustment may be made based in part on the power state of the system. For example, if the system enters a low power state, the module(s) 280 may modify the full-scale range of an 8-bit analog-to-digital converter from 10.0 V to 2.0 V. In this way, the voltage resolution will be approximately 31.25 mV, instead of 156.25 mV, over the range from 0.0 V to 2.0 V. In other words, modifying the resolution to correspond to the power state may provide 256 quantization levels in the range of 0-2 V, instead of about 12-13 quantization levels in the range of 0-2 V if the full-scale range were 10.0 V. In some embodiments, the power states of the system may conform to the power states defined in the Advanced Configuration and Power Interface (ACPI) open standard. See, Advanced Configuration and Power Interface Specification, Revision 3.0a, published by Hewlett-Packard Corporation, Intel Corporation, Microsoft Corporation, Phoenix Technologies Ltd., and Toshiba Corporation, Dec. 30, 2005, currently available at http://www.acpi.info. For example, processors may operate in various "C" power states ranging from C0 (full power) to C4 (low power), although other power states may be defined and implemented.

Figure 3:
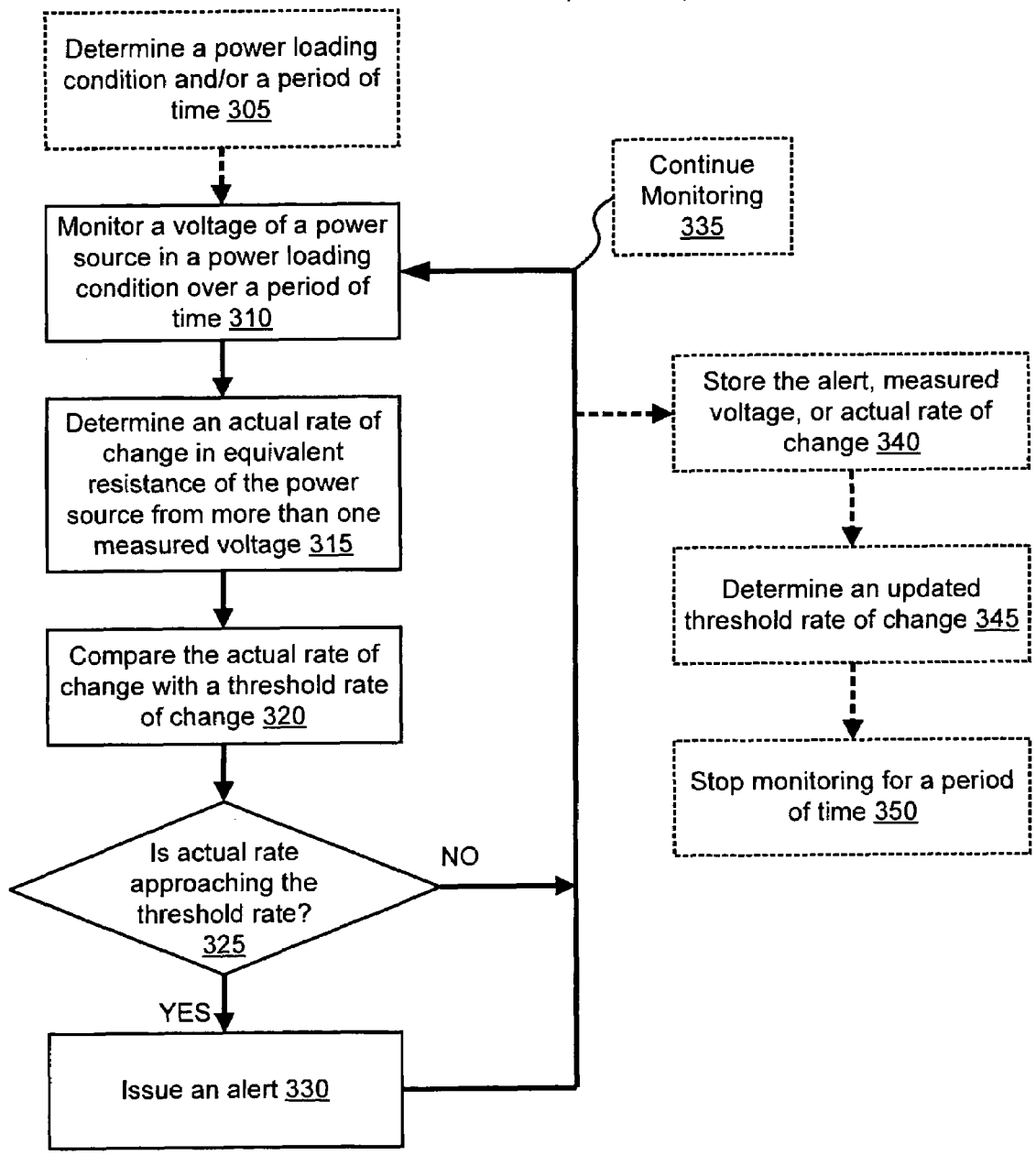
FIG. 3 illustrates methods for power source failure prediction, according to some embodiments of the invention.

FIG. 3 illustrates methods 300 for power source failure prediction, according to some embodiments of the invention. In some embodiments, the process may begin at operation 310, where the process may monitor a voltage of a DC power source in a power loading condition over a period of time. In some embodiments, the power source may be power source(s) 105. Furthermore, the CMU 55 and/or electrical lines 56 may be used to perform the monitoring, as is described elsewhere herein with respect to embodiments of the invention. The process may then proceed to 315, where it may determine an actual rate of change in equivalent resistance of the DC power source from more than one measured voltage. In some embodiments, the PSMU 130 or CMU 55 may perform this determination.

The process may then proceed to 320, where it may compare the actual rate of change with a threshold rate of change. The process may then proceed to 325, where it may determine whether the actual rate of change approaches the threshold rate of change. In some embodiments, the PSMU 130 or CMU 55 may perform the comparison and/or determination. In circumstances where the actual rate is approaching the threshold rate, the process may then proceed to 330, where it may issue an alert. In some embodiments, the threshold for when the actual rate is deemed to have approached the threshold rate is predetermined by the user, a maker of the power source apparatus 100, or the system. Moreover, in some embodiments, the alert may be issued when the actual rate of change is substantially equal to or greater than the threshold rate of change.

According to some embodiments, the threshold rate of change may be a threshold rate of change that would indicate a potential failure of the power source. Moreover, in some embodiments, the threshold rate of change may be determined or updated, as described elsewhere herein, based on, but not limited to, such factors as the cycle life of the power source, the state of charge of the power source, known source variations, and other factors that one of ordinary skill in the relevant art would appreciate based at least on the teachings provided herein.

The process may then optionally proceed to 335, where it may continue to monitor the voltage. In some embodiments, the process may proceed to 335 in the event that the actual rate of change does not approach the threshold rate of change. Furthermore, the process may optionally proceed to 340, where it may store the alert, the measured voltage, or the actual rate of change. In some embodiments, these events and data may be useful for the apparatus 100, the system, or the user. The process may optionally proceed to 345, where it may determine an updated threshold rate of change. In some embodiments, the updated threshold rate may be determined, either wholly or in part, from previous alerts, previously measured voltages, and/or previous rates of change, desired and/or actual. The process may optionally proceed to 350, where it may stop the monitoring for a period of time. In some embodiments, the period of time may be determined by the system, the apparatus 100, or the user. In process may begin again at any point, as one of ordinary skill in the relevant art would appreciate based at least on the teachings provided herein.

In some embodiments, the process may optionally perform the operation of determining the power loading condition or the period of time. As is described elsewhere herein, the loading conditions may be determined by various components and be based on various factors. Furthermore, as is similarly described elsewhere herein, the period of time may be determined by various components and be based on various factors.

Figure 4:
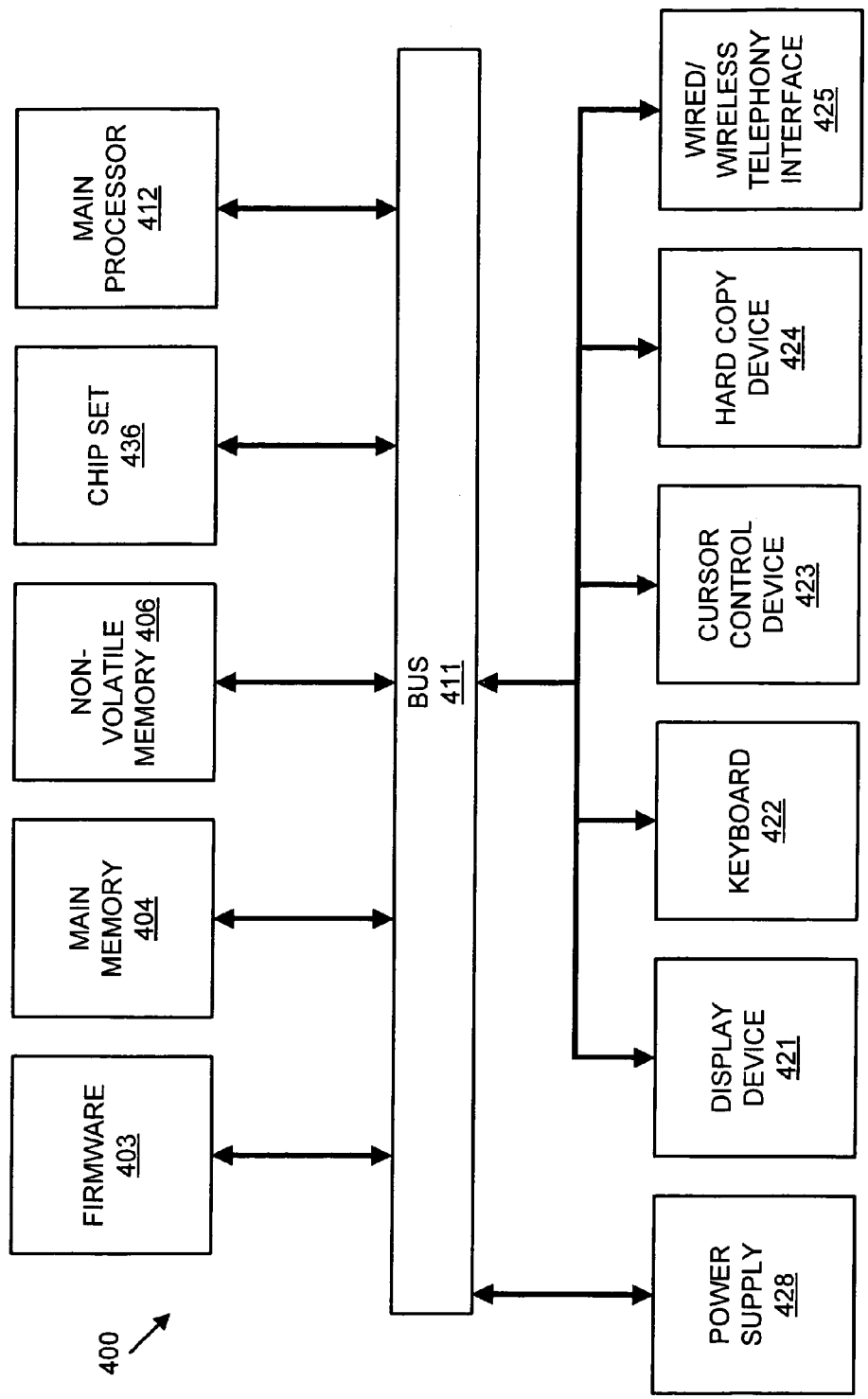
FIG. 4 illustrates an example system in which the embodiments for power source failure prediction may be implemented, according to some embodiments of the invention.

FIG. 4 illustrates an example system 400 in which the embodiments for power source failure prediction may be implemented, according to some embodiments of the invention. In some embodiments, the system 400 may be of a type that is always, optionally, occasionally, or frequently powered by a direct current (DC) power source such as a fuel cell or a battery which supplies DC voltage to the system. As such, the DC power source may be recharged on a periodic basis.

In some embodiments, the system 400 includes a communication mechanism or bus 411, for communicating information, and an integrated circuit component such as a main processing unit 412 coupled with bus 411 for processing information. One or more of the components or devices in the system 400 such as the main processing unit 412 or a chipset 436 may be powered by the DC power source. The main processing unit 412 may include one or more processor cores working together as a unit.

The system 400 may also include a random access memory (RAM) or other dynamic storage device 404 (referred to as main memory) coupled to the bus 411 for storing information and instructions to be executed by the main processing unit 412. The main memory 404 also may be used for storing temporary variables or other intermediate information during execution of instructions by the main processing unit 412. The system 400 also includes a read-only memory (ROM) and/or other static storage device 406 coupled to the bus 411 for storing static information and instructions for the main processing unit 412. The static storage device 406 may store operating system (OS) level and application level software.

The firmware 403 may be a combination of software and hardware, such as electronically programmable read-only memory (EPROM), which has the operations for the routine recorded on the EPROM. The firmware 403 may include embedded foundation code, basic input/output system code (BIOS), or other similar code. The firmware 403 may make it possible for the system 400 to instantiate.

Additionally, the system 400 may be coupled to or have an integral display device 421, such as a cathode ray tube (CRT) or liquid crystal display (LCD), coupled to the bus 411 to display information to a computer user. In one embodiment, the chipset 436 may interface with the display device 421.

An alphanumeric input device (keyboard) 422, including alphanumeric and other keys, also may be coupled to the bus 411 for communicating information and command selections to the main processing unit 412. Furthermore, a cursor control device 423, such as a mouse, trackball, trackpad, stylus, or cursor direction keys, may be coupled to the bus 411 for communicating direction information and command selections to the main processing unit 412, and for controlling cursor movements on the display device 421. In some embodiments, the chipset 436 may interface with the I/O devices. Similarly, devices capable of making a hardcopy 424 of a file, such as a printer, scanner, copy machine, etc., also may interact with the input/output chipset 436 and bus 411.

A power supply 428 such as a DC power source may be coupled to the bus 411. In some embodiments, the DC power source is a battery and alternating current (AC) adapter circuit. Furthermore, a sound recording and playback device, such as a speaker and/or microphone (not shown), may optionally be coupled to the bus 411 for audio interfacing with system 400. A wireless communication module 425 also may be coupled to the bus 411. The wireless communication module 425 may employ a wireless application protocol (WAP) to establish a wireless communication channel. The wireless communication module 425 may implement a wireless networking standard such as Institute of Electrical and Electronics Engineers (IEEE) 802.11 standard, IEEE std. 802.11-1999, published by IEEE in 1999. In some embodiments, other types of wireless technologies may be implemented in the system 400.

Embodiments of the invention include various operations, which as described herein. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing device(s) described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple micro-engines. Additionally, the digital processing device may include any combination of general-purpose processing device(s) and special-purpose processing device(s).

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an ASIC or FPGA. Also, logic may comprise machine-readable instructions stored in a memory in combination with processing circuitry to execute such machine readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a FPGA, an ASIC or the like.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of ordinary skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
   two or more electrical lines positioned on either side of a direct current power source to determine a first voltage and a second voltage across the direct current power source when the direct current power source is to provide power to a computing platform; and
   a power source management unit coupled to the two or more electrical lines to:
   measure the first voltage in a first time instant during one or more power loading conditions of the computing platform and to measure the second voltage in a second time instant during the one or more power loading conditions of the computing platform;
   determine a rate of change in equivalent resistance of the direct current power source based on the measured first and second voltages; and
   predict failure of the direct current power source based on the rate of change.

2. The apparatus of claim 1, wherein the power source management unit comprises a voltage measurement module to measure the rate of change between the first voltage and the second voltages, wherein the voltage measurement module comprises an analog-to-digital converter to convert the measured first and second voltages to a first and a second digital signal respectively, and wherein the power source management unit to determine the rate of change in equivalent resistance of the direct current power source based on the measured first and second voltages is to determine the rate of change in equivalent resistance of the direct current power source based on the first and second digital signals.

3. The apparatus of claim 2, wherein the voltage measurement module in the power source management unit is further to compare the rate of change between the first and second voltages with a threshold rate of change between the first and second voltages and send an alert signal when the rate of change between the first and second voltages approaches the threshold rate of change.

4. The apparatus of claim 1, wherein the direct current power source includes a battery or a fuel cell or both.

5. The apparatus of claim 1, wherein the direct current power source is in one or more cells.

6. The apparatus of claim 1, further comprising:
a cell monitoring unit coupled with the two or more electrical lines to:
measure the first and second voltages for the power source management unit, wherein the cell monitoring unit is capable of converting the measured first and second voltages to a first and a second digital signal respectively;
measure the rate of change between the first and second voltage; and
provide information to the power source management unit.

7. The apparatus of claim 1, where the power source management unit comprises:
a voltage measurement module to measure the first and the second voltages; and
an analog front end coupled with the voltage measurement module to drive a charge transistor to charge the direct current power source and to drive a discharge transistor to facilitate operation of the computing platform.

8. The apparatus of claim 7, wherein the power source management unit further comprises:
a power gauging module coupled with the analog front end to determine how much electrical energy is stored in the direct current power source;
a protection module coupled with the analog front end to protect the direct current power source from a potential failure event; and
an interface coupled with the analog front end to interface with a system processor of the computing platform.

9. The apparatus of claim 8, wherein the protection module is to:
receive an alert signal from the voltage measurement module; and
signal the analog front end to drive the discharge transistor to substantially isolate the direct current power source.

10. The apparatus of claim 1, where the power source management unit is further to determine the one or more power loading conditions of the computing platform.

11. A system, comprising:
a display device to draw power from a direct current power source of a computing platform;
two or more electrical lines positioned on either side of the direct current power source to determine a first and a second voltage across the direct current power source; and
a power source management unit coupled to the two or more electrical lines to:
measure the first voltage in a first time instant during one or more power loading conditions of the computing platform and to measure the second voltage in a second time instant during the one or more power loading conditions of the computing platform;
determine rate of change in equivalent resistance of the direct current power source based on the measured first and second voltages; and
predict failure of the direct current power source based on the rate of change.

12. The system of claim 11, wherein the power source management unit comprises a voltage measurement module to measure the rate of change between the first and second voltages, wherein the voltage measurement module comprises an analog-to-digital converter to convert the measured first and second voltages to a first and a second digital signal respectively, and wherein the power source management unit to determine the rate of change in equivalent resistance of the direct current power source based on the measured first and second voltages is to determine the rate of change in equivalent resistance of the direct current power source based on the first and second digital signals.

13. The system of claim 12, wherein the voltage measurement module is to:
compare the rate of change between the first and second voltages with a threshold rate of change between the first and second voltages; and
send an alert signal when the rate of change between the first and second voltages approaches the threshold rate of change.

14. The system of claim 11, wherein the direct current power source includes a battery or a fuel cell or both.

15. The system of claim 11, wherein the direct current power source is in one or more cells.

16. The system of claim 11, further comprising:
a cell monitoring unit coupled with the two or more electrical lines to:
measure the first and second voltages for the power source management unit, wherein the cell monitoring unit is capable of converting the measured first and second voltages to a first and a second digital signal respectively;
measure the rate of change between the first and second voltages; and
provide information to the power source management unit.

17. The system of claim 11, wherein the system comprises a mobile computing platform or a server computing platform.

18. The system of claim 11, where the power source management unit comprises:
a voltage measurement module to measure the first and the second voltages; and
an analog front end coupled with the voltage measurement module to drive a charge transistor to charge the direct current power source and to drive a discharge transistor to facilitate operation of the computing platform.

19. The system of claim 18, wherein the power source management unit further comprises:
a power gauging module coupled with the analog front end to determine how much electrical energy is stored in the direct current power source;
a protection module coupled with the analog front end to protect the direct current power source from a potential failure event; and
an interface coupled with the analog front end to interface with a system processor of the computing platform.

20. The system of claim 19, wherein the protection module is to:
receive an alert signal from the voltage measurement module; and
signal the analog front end to drive the discharge transistor to substantially isolate the direct current power source.

21. The system of claim 11, where the power source management unit is further to determine the one or more power loading conditions of the computing platform.

22. A method, comprising:
determining a power loading condition of a computing platform;

monitoring a first and a second voltage of a direct current power source during the determined power loading condition of the computing platform over a period of time;

determining a rate of change in equivalent resistance of the direct current power source based on the first and second voltages;

comparing the rate of change with a threshold rate of change; and issuing an alert when the rate of change approaches the threshold rate of change.

23. The method of claim 22, further comprising continuing to monitor the first and second voltages.

24. The method of claim 22, further comprising storing the alert, the measured first and second voltages, or the actual rate of change.

25. The method of claim 22, further comprising determining an updated threshold rate of change.

26. The method of claim 22, further comprising stopping the monitoring for a period of time.

27. The method of claim 22, wherein the alert is issued when the actual rate of change is substantially equal to or greater than the threshold rate of change.

28. The method of claim 22, further comprising determining the period of time.

* * * * *